United States Patent [19]

Nakagawa

[11] Patent Number: 5,276,551
[45] Date of Patent: Jan. 4, 1994

[54] RETICLE WITH PHASE-SHIFTERS AND A METHOD OF FABRICATING THE SAME

[75] Inventor: Kenji Nakagawa, Isehara, Japan
[73] Assignee: Fujitsu Limited, Kawasaki, Japan
[21] Appl. No.: 716,987
[22] Filed: Jun. 18, 1991
[30] Foreign Application Priority Data
Jun. 20, 1990 [JP] Japan .................. 2-163434
[51] Int. Cl.$^5$ .................. G02B 27/44; G02B 5/18; G02B 1/10
[52] U.S. Cl. .................. 359/565; 359/571; 359/580; 430/5
[58] Field of Search .................. 359/565, 571, 580, 619, 359/741, 742; 430/5

[56] References Cited

U.S. PATENT DOCUMENTS

| | | | |
|---|---|---|---|
| 3,547,546 | 12/1970 | Schier | 359/565 |
| 4,530,736 | 7/1985 | Mutter | 359/742 |
| 4,737,447 | 4/1988 | Suzuki et al. | 359/742 |

Primary Examiner—Bruce Y. Arnold
Assistant Examiner—Darryl Collins
Attorney, Agent, or Firm—Staas & Halsey

[57] ABSTRACT

A reticle and a method of fabricating the samer for projecting a fine pattern on an object surface comprises: a. transparent substrate; a first type phase-shifter selectively patterned and deposited on the substrate producing a phase difference between the light passing therethrough and the light passing through the other areas without phase-shifter; and a second type phase-shifter selectively patterned and forming a groove in the substrate producing a phase difference between the light passing therethrough and the light passing through the other areas without phase-shifter. The reticle may include a patterned shield layer which interrupts transmission of light, and the phase difference of the first and second type phase-shifters is many times selected substantially equal to a half wavelength of light. Another type of a reticle comprises: a transparent substrate; a phase-shifter of a first groove; and another phase-shifter of a second deeper groove formed in the first groove.

17 Claims, 8 Drawing Sheets

RETICLE WITH PHASE-SHIFTERS AND A METHOD OF FABRICATING THE SAME

BACKGROUND OF THE INVENTION

1. Field of the Invention

This invention relates to a reticle used for projecting a very fine pattern on a semiconductor substrate in photolithography and, more particularly, to a reticle into which phase-shifters are incorporated and to a method of fabricating the reticle with the phase-shifters.

With a trend toward higher integration of an integrated circuit, patterns formed on a semiconductor substrate in photolithography are required to be ever finer and more precise. A reticle having phase-shifters is one of the solutions therefor.

2. Description of the Related Art

It is known that a magnified pattern with a magnification ratio of about 1 to 10 is formed on a reticle and the reticle pattern is projected forming a reduced real image on a semiconductor substrate by a step and repeat method using a so-called stepper.

When dimensions constituting the pattern on the semiconductor substrate are reduced to submicron order, there arises a problem in that two lights which penetrate through two adjacent transparent portions of the reticle pattern, the two portions being separated by a narrow strip portion containing the pattern to be projected onto the substrate, interfere with each other, and accurate strip pattern is not projected and formed on the semiconductor substrate.

In order to solve the interference problem between the two adjacent lights, a phase-shifter technique has been introduced into the reticle fabrication process.

Typical known reticle structures with phase-shifters are described herein. FIG. 1 shows a cross section of a known reticle structure with phase-shifters. On a reticle substrate 1 manufacture of glass or quartz, a light-shielding layer 2 and 2' containing the pattern to be projected onto the substrate (hereinafter abbreviated as shield layer), generally a chromium (Cr) or a chromium compound is formed in a conventional method. Of the two adjacent openings 30 and 31, one opening 31 between shield layers 2 and 2' is covered with a phase-shift layer 3 (hereinafter abbreviated as phase-shifter) which has a function of improving the resolution in photolithography.

The lights 33 and 34 impinging on the bottom surface of the reticle and traveling a distance t, undergo a different phase shift due to an existence of the phase-shift layer 3 (in an actual case, the reticle is arranged upside down in the stepper). When a thickness of the phase-shift layer is properly selected, two lights passing through the reticle can be made to have an opposite phase (phase-shift of $\pi$) to each other. This results in forming a distinct image pattern of the middle Cr layer 2' onto the semiconductor substrate because the adverse effects from the adjacent lights from both sides are eliminated.

FIG. 2 shows a cross section of another known reticle structure with phase-shifters. In the same way as in FIG. 1, a pattern of light-shielding layers 2 are formed on a glass substrate 1. However, in this case, a phase-shifter 3' has the shape of a groove or well formed under a window 31 between the two adjacent light-shielding layers 2 and 2'. The groove is formed by subjecting the substrate 1 to a conventional unisotropic etching process such as RIE (Reactive Ion Etching), in which only the substrate surface for the area where the groove is to be formed is exposed and the remaining areas are covered with a resist layer. The function of the phase-shifter 3' is almost the same as the phase-shifter 3 of FIG. 1. However, in this case, the light 33 traveling a distance d within the substrate causes a phase difference of $\pi$ from the light 34 which travels the same distance d through the groove without substrate material.

With a reticle with phase-shifters, fine complicated patterns are formed on a semiconductor substrate. However, in the process of fabricating a reticle, defects are often formed in the patterns of shield layer 2 or phase-shifters 3. In addition, though a reticle with phase-shifters has been completed, it may be required that a small portion of the pattern needs to be modified or changed. Therefore, it is an important that the reticle pattern be able to be repaired or modified.

When it is found that the shield layer 2 includes a missing portion or void portion, or an unnecessary extra portion in its pattern before forming phase-shifters, these defect portions are comparatively easily repaired using a Focused Ion Beam (hereinafter abbreviated as FIB) apparatus.

When the phase-shifter 3 is formed and includes a missing portion or an unnecessary extra portion in its pattern, the extra portion can be removed using the above FIB apparatus and the reticle can be repaired. However, if the defect is a missing portion in the phase-shifter pattern, the reticle can not be repaired easily.

The FIB apparatus will be briefly described. FIG. 3 shows a schematic cross section of the FIB apparatus. Ions are emitted from an ion gun 6 and gallium (Ga) ions are popularly used therein. The emitted ions are focused by a condenser lens 7 and further on-off controlled by a blanking electrode 8 and a blanking aperture 9. An object lens 10 and a deflection lens 11 have the function of focusing and projecting an ion beam onto an object 14 to be processed at a specified scanning position. The object can be moved by an XY-table 15. The ion beam can sputter-and-etch the object, and a secondary ion detector 12 can detect the object and identify the ion beam position. When a gas is introduced from a gas injection gun 13, the ion beam resolves or separates the gas, and the resolved elements or components can be deposited on the object 14.

In order to remove the unnecessary extra, portion of the shield layer 2 or the phase shifter 3, the unnecessary portion is subjected to irradiation of the above ion beam by moving the XY-table and scanning the ion beam. However, when the phase-shifter 3 of FIG. 1 has a missing portion, or when the groove-shaped phase-shifter 31 of FIG. 2 includes an extra groove portion which should not have been taken away, the process of depositing phase-shifter material or substrate material and repairing the void or missing portion of the phase-shifters is very difficult. The reason is that the thickness of phase-shifter 3 and depth of phase-shifter 3' is too large or deep (a few thousands angstroms) to bury or fill the void portion using the FIB apparatus. Even if silicon dioxide, which is a popular material for a phase-shifter, is deposited by the FIB apparatus, the deposited phase-shifter contains gallium. Since the gallium containing silicon dioxide is not transparent, silicon dioxide does not work as a phase-shifter.

SUMMARY OF THE INVENTION

It is a general object of the invention, therefore, to provide a reticle which comprises at least two types of phase-shifters i.e., the phase-shift layer and the phase-shift groove.

It is a more specific object of the invention to provide a reticle with phase-shifters which can easily meet a requirement of a small pattern change after completion of reticle fabrication.

It is another object of the invention to provide a reticle with phase-shifters which can easily be repaired from any pattern defect.

It is still another object of the invention to provide a method of fabricating the above reticle with phase-shifters.

It is a further object of the invention to provide a method of repairing the pattern of the above reticle with phase-shifters.

The foregoing and related objects are accomplished by the invention of a reticle comprising: a transparent substrate; a first type phase-shifter selectively patterned and deposited on the substrate producing a phase difference between the light passing through the deposited phase-shifter and the light passing through the other areas which do not contain a phase-shifter; and a second type phase-shifter selectively patterned and forming a groove in the substrate producing a phase difference between the light passing through the grooved phase-shifter and the light passing through the other areas of the substrate without a phase-shifter. The reticle may further include a patterned shield layer which interrupts or prevents transmission of light. In addition, the phase difference between the first and second type phase-shifters is many times selected substantially equal to a half wavelength of light.

Another type of a reticle of the present invention comprises: a transparent substrate; a first phase-shifter selectively patterned and forming a first groove in the substrate producing a first phase difference between the light passing through the first groove and the light passing through the other areas of the substrate without phase-shifters; and a second phase-shifter selectively patterned and formed within the region of the first groove, forming a second deeper groove producing a second phase difference between the light passing through the second groove and the light passing through the first groove.

A method according to fabricating a reticle of the present invention, comprising a groove shaped phase-shifter, can be preferably achieved by utilizing a Focused Ion Beam apparatus, wherein a halogen containing gas is injected onto the groove forming region through a gas injection gun provided with the apparatus and at the same time the groove forming region is subjected to ion beam irradiation.

Details of these variations will become clear from a reading of the detailed description of the invention with reference to the drawings.

BRIEF DESCRIPTION OF THE DRAWINGS

FIGS. 4(a) and 4(b) show a top view of a shield layer and a phase-shifter formed on a reticle substrate, wherein FIG. 4(a) shows a case where the correct pattern is formed, and FIG. 4(b) shows that the shield layer has defects.

The same reference numerals designate the same or corresponding parts throughout the drawings.

DETAILED DESCRIPTION OF THE PREFERRED EMBODIMENTS (1) First Embodiment

Details of a first embodiment of the the present invention are disclosed referring to FIGS. 4(a) and 4(b), and FIGS. 5(a) through 5(d).

Figure 4A:
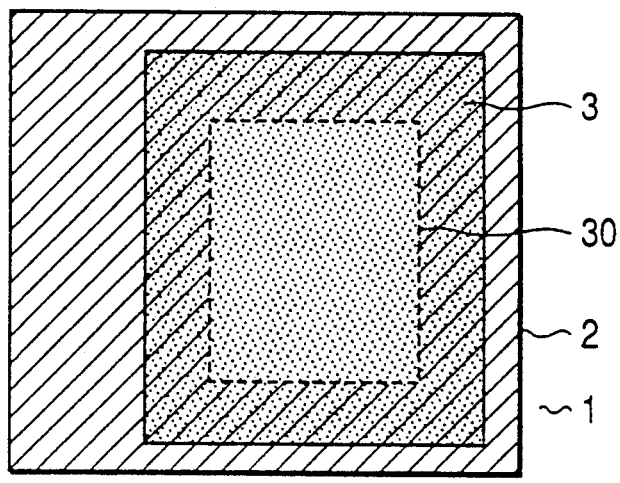

FIG. 4(a) shows a portion of a top view of a reticle with phase-shifters having a correct pattern of a shield layer 2 which has a rectangular outline and a rectangular opening 30. The shield layer 2 is formed by depositing a Cr layer having a thickness of 600 to 800 angstroms which is subsequently patterned by a conventional photolithography technique. The first embodiment utilizes a positive type phase-shifter 3, therefore, the phase-shifter 3 is formed by depositing a silicon dioxide ($SiO_2$) layer and thereafter the $SiO_2$ layer, is patterned. A thickness of the phase-shifter 3 is about 3900 angstroms when an ion beam is used in the stepper. The thickness of the phase-shifter 3 is much larger than that of the shield layer 2.

Figure 4B:
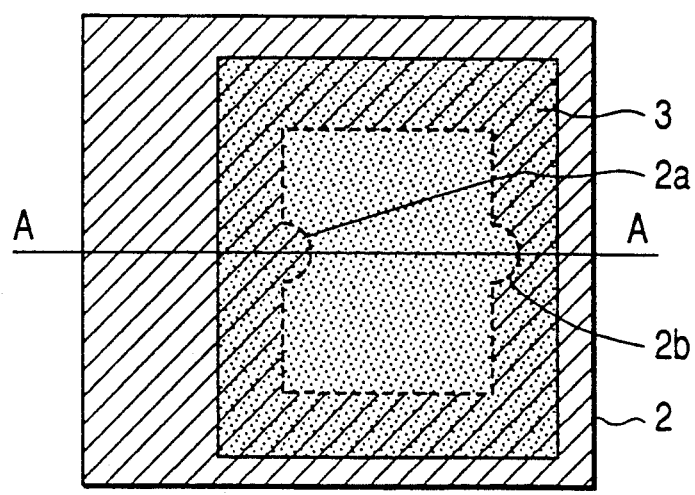

FIG. 4(b) shows a similar top view of the reticle with phase-shifters as FIG. 4(a), however in this case, the shield layer 2 has defective portions 2a and 2b. The portion 2a is an extra protrusion and the portion 2b is a missing portion, both being transformed from the normally straight line periphery of the shield layer. The shapes of defects in the figure are quite schematic and these defects can be easily repaired if the phase-shifter 3 has not yet been formed on the shield layer 2.

After formation of the phase-shifter 3, defective portions of the substrate are often required to be repaired such that the extra portion 2a is removed and the missing portion 2b is supplemented or filled. A method of repairing defective portions is next explained referring to FIGS. 5(a) through 5(d).

Figure 5A:
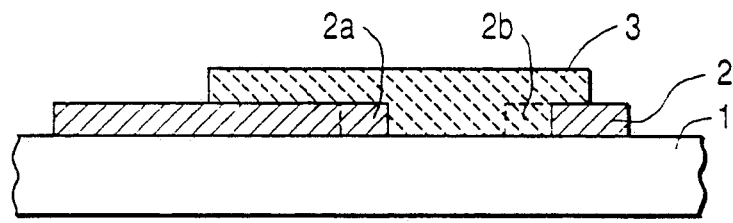
FIGS. 5(a) to 5(d) show a cross sectional view of the reticle with phase-shifters during the repair process in sequential steps, in which the reticle having defects such as in FIG. 4(b) is repaired (first embodiment)
Figure 5B:
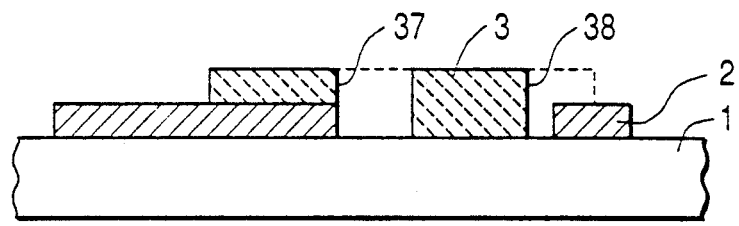

FIGS. 5(a) to 5(d) show a cross sectional view at sequential steps of the repair along line A—A in FIG. 4(b). FIG. 5(a) shows a cross section at an initial stage before the repair process, in which defective portions 2a and 2b in the shield layer 2 are shown by dashed lines. First as shown in FIG. 5(b), the portion of the phase-shifter 3 lying on the extra portion 2a and the portion 2a of the shield layer are removed by a sputter-and-etch method using the previously explained FIB apparatus of FIG. 3 forming an opening 37. Thereafter the phase-shifter portion burying or covering the void a missing portion 2b and the neighboring portion on the shield layer 2 are removed using the same apparatus forming an opening 38.

Figure 1:
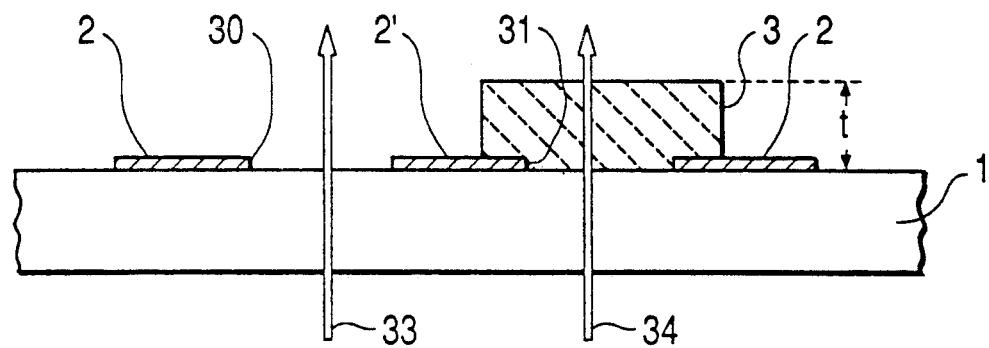
FIG. 1 shows a cross sectional view of a reticle with the phase-shifters of the prior art, in which a deposited (hereinafter called a positive type) phase-shifter is formed on a reticle substrate.
Figure 2:
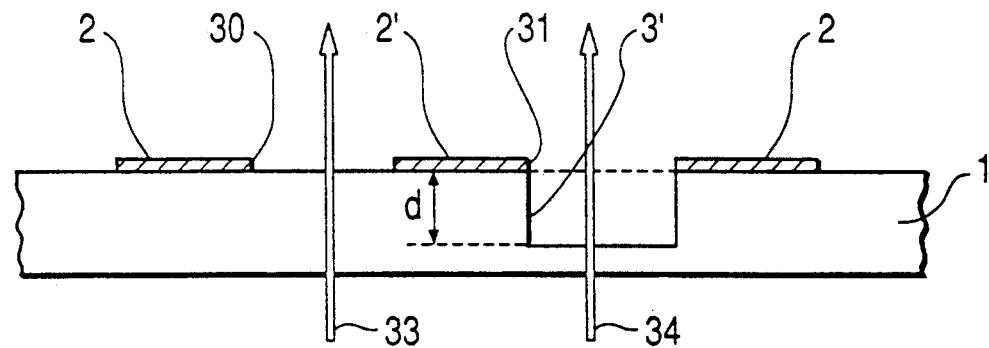
FIG. 2 shows a cross sectional view of a reticle with the phase-shifters of the prior art, in which a grooved (hereinafter called a negative type) phase-shifter is formed in a reticle substrate.
Figure 3:
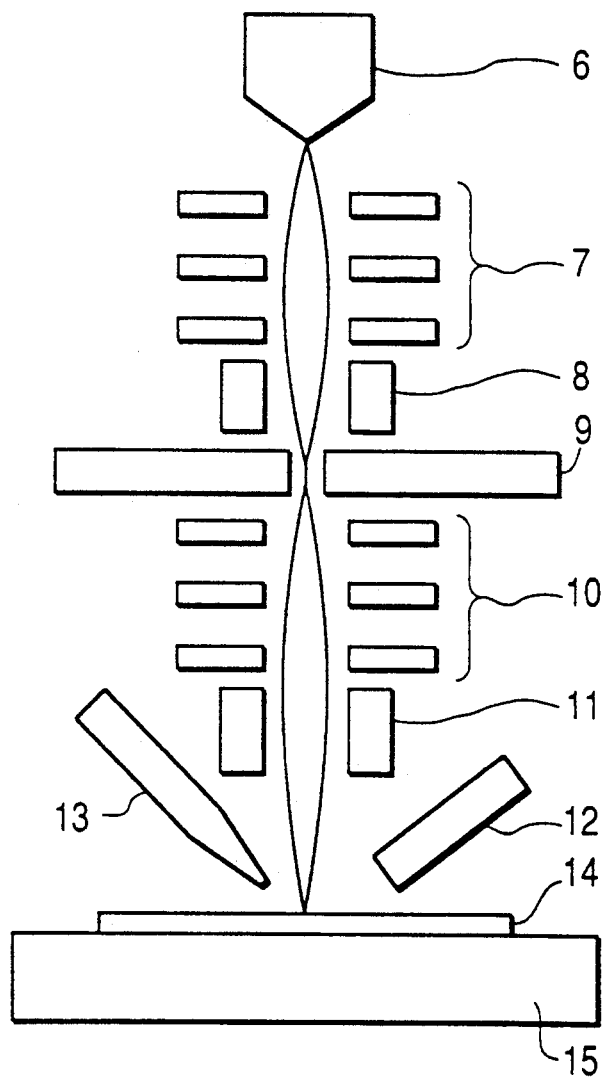
FIG. 3 shows a schematic cross section of a focused ion beam (FIB) apparatus used in fabricating a reticle with the phase-shifters of the present invention.
Figure 5C:
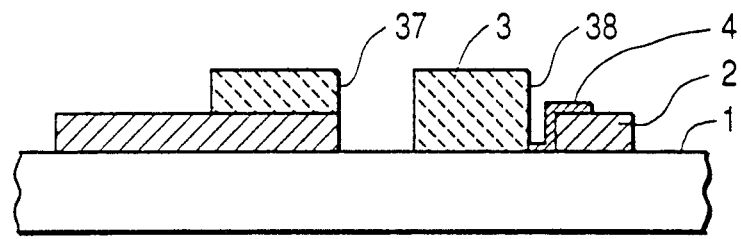

Next, the process of repair involves injecting a tungsten-hexacarbonyl [W(CO)$_6$] gas through a gas injection gun 13 in the FIB apparatus of FIG. 3 into the opening 38, a tungsten layer 4 is deposited as shown in FIG. 5(c).

Figure 5D:
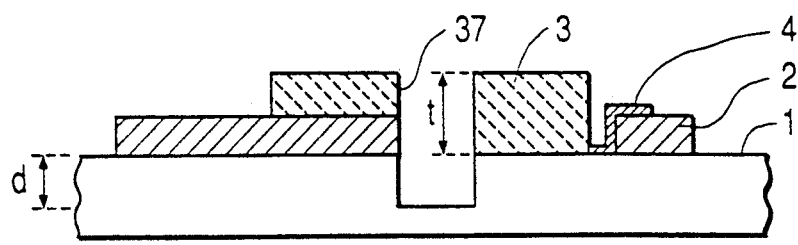

Next, the exposed surface of the reticle substrate 1 in the opening 37 is subjected to a sputter-and-etch process using the FIB apparatus, resulting in forming a groove having a depth d as shown in FIG. 5(d).

The necessary depth amount d is determined according to the following equations;

$$(nd/\lambda) - (d/\lambda) = (1+2m)/2, \text{ or } d = \lambda(1+2m)/2(n-1), \qquad (1)$$

where n is a refractive index of the substrate material, $\lambda$ is a wavelength of light used in the stepper, and m is an integer, such as 0, 1, 2, . . . .

The above equations are used for the depth of the groove type phase-shifter (negative type phase-shifter). However, similar equations are used for a thickness t of the deposited phase-shifter (positive type phase-shifter), in which depth d is replaced by thickness t and refractive index n is used for the material of the deposited phase-shifter.

By calculation, the depth d is given as about 3900 angstroms for a quartz or glass substrate, which is substantially equal to a thickness t of the positive type deposited SiO$_2$ phase-shifter.

However, thickness t and depth d of the phase-shifters of the present invention are not restricted to the amount specified by the equation. Different or varing amounts of thickness or depth for phase-shifters may be effective to improve the formed pattern on an object.

(2) Second Embodiment

Figure 6A:
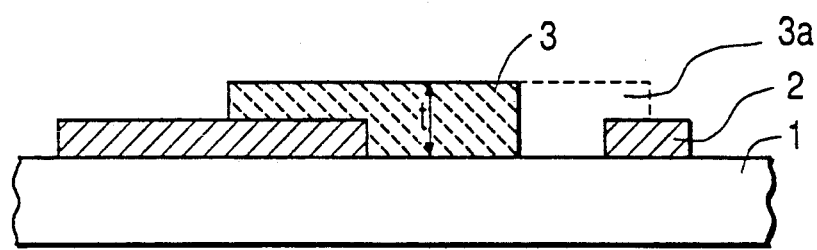
FIGS. 6(a) and 6(b) show a cross sectional view of a reticle with positive type phase-shifters, and the reticle having a defect is shown in FIG. 6(a), and the reticle repaired is shown in FIG. 6(b) (second embodiment)
Figure 6B:
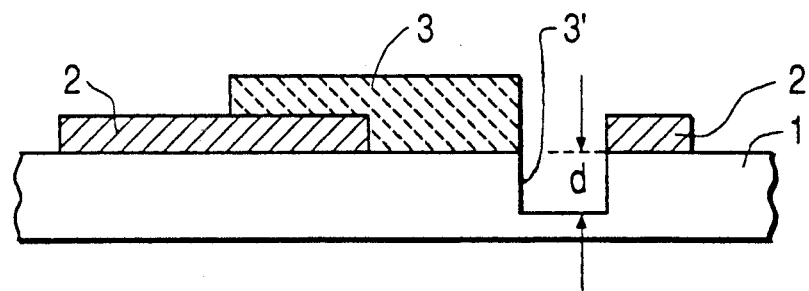

Next, a second embodiment of the present invention is explained will respect to FIGS. 6(a) and 6(b). FIG. 6(a) is a cross sectional view of a reticle with phase-shifters of a positive type, in which a phase-shifter 3 includes a defect of missing portion 3a. A thickness t of the phase shifter 3 is determined by the above modified calculation using equation (1). In the actual embodiment of FIG. 6(a), since the SiO$_2$ layer is used as the phase-shifter 3, in this case, the thickness t is about 3900 angstroms for the refractive index of SiO$_2$.

In order to repair the defect portion 3a, it is difficult to deposit a SiO$_2$ layer using the FIB apparatus, because the required thickness is too large and the deposited layer is not transparent. In accordance with the present invention, the defect portion 3a is repaired by forming a groove having a depth d, which means a negative type phase shifter 3', is grooved into the reticle substrate 1 as shown in FIG. 6(b). Thus, a second groove phase-shifter is formed on an adjacent side to the first deposited phase-shifter which is defective. The depth d is provided by the previous equation (1). The negative type phase-shifter 3' can be formed by a sputter-and-etch process utilizing the FIB apparatus.

Figure 7A:
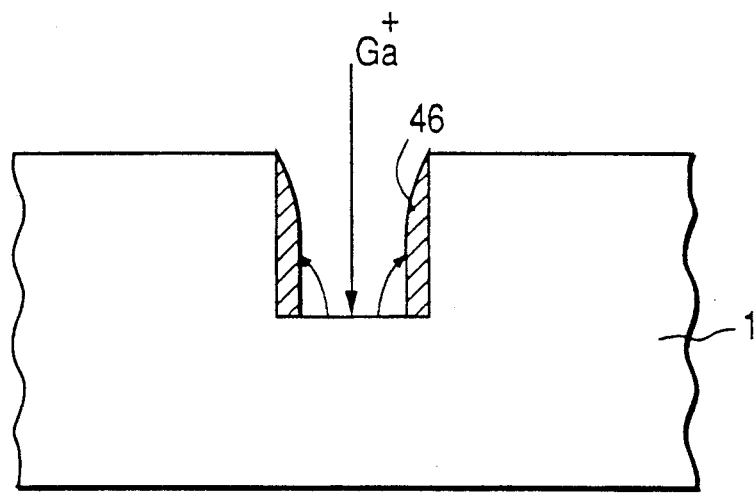
FIGS. 7(a) and 7(b) show a cross sectional view of an enlarged groove for explaining or illustrating the repairing method of the groove in accordance with the present invention.

In forming the groove, it is preferable that the sidewall and the bottom surface of the groove are respectively as vertical and parallel to the substrate surface as possible. FIG. 7(a) shows an enlarged cross sectional view of the grooved portion 46 only, where the groove shows rather a sharp trench shape having, for example, a width of about 0.2 to 0.4 $\mu$m and a depth of about 0.39 $\mu$m. However, when Ga ions are irradiated into the groove formed in the substrate, the substrate material such as quartz or glass is sputtered from the substrate and the sputtered material deposits on the sidewall of the groove 46 as shown in FIG. 7(a) making the trench shape less sharp.

Figure 7B:
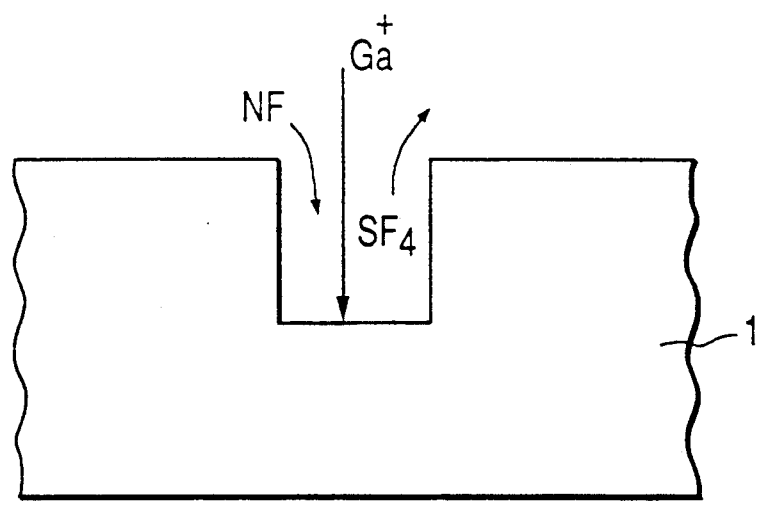

In the embodiment as shown in FIG. 7(b), it is found that a gas selected among the group of carbon tetrafluoride gas (CF$_4$), nitrogen fluoride gas (NF$_3$), fluorine gas (F$_2$), sulfur fluoride gas (SF$_6$), hydrogen fluoride gas (HF), and chlorine gas (Cl$_2$), is injected from the gas injection gun 13 in the FIB apparatus. The gas combines with the substrate material and the object is to remove the substrate material when it is in a volatile silicon compound form such as silicon fluoride (SiF$_4$). This method prevents the substrate material from depositing on the sidewall of the groove.

(3) Third Embodiment

Figure 8A:
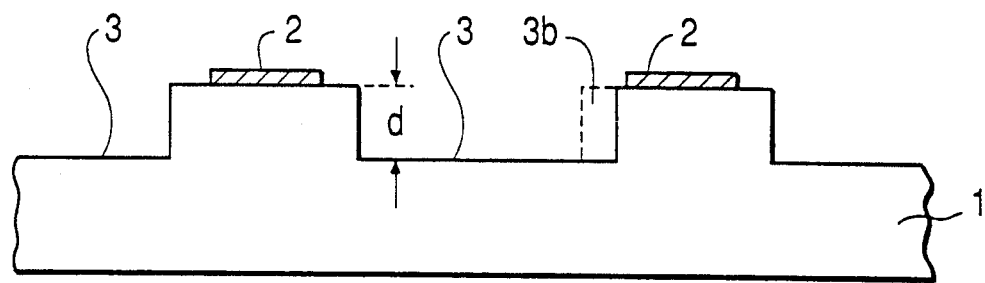
FIGS. 8(a) and 8(b) show a cross sectional view of a reticle with negative type phase-shifters, and the reticle having a defect is shown in FIG. 8(a), and the reticle repaired is shown in FIG. 8(b) (third embodiment)
Figure 8B:
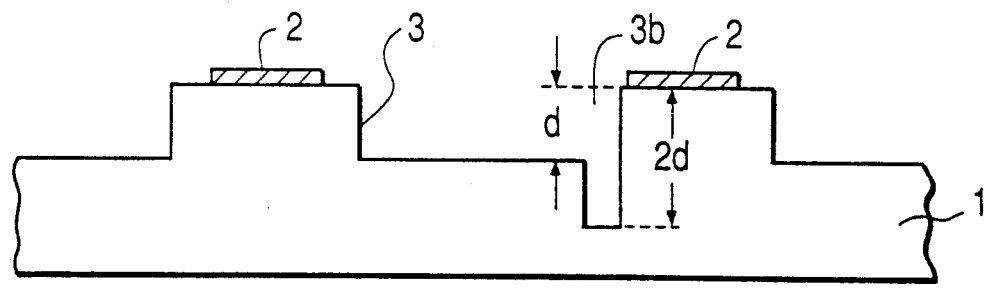

A third embodiment of the present invention is explained by referring to FIGS. 8(a) and 8(b). FIG. 8(a) shows a cross sectional view of a reticle with phase-shifters, in which negative type phase-shifters 3 are formed in a reticle substrate 1 between shield layers 2. The phase-shifter 3 has a defective portion 3b, which should not have been removed to have formed a correct phase-shifter pattern.

Since the process of depositing the substrate material (glass) into the defect void or missing portion 3 and burying or filling the void portion, is difficult because of a large depth and lack of transparency of the filling material, it has been found that, when an additional negative type phase-shifter is added under the void or missing portion 3b, it has the same effect as the void portion was buried or filled with deposited material. The depth of the defect portion is increased to 2d, which is twice the normal phase-shifter depth d. The depth 2d means that light traveling the distance 2d receives a phase-shift of one full wavelength (2$\pi$ phase-shift), and therefore, it shows the same characteristic as if no phase-shifter is formed at the void portion 3b.

(4) Fourth Embodiment

Figure 9A:
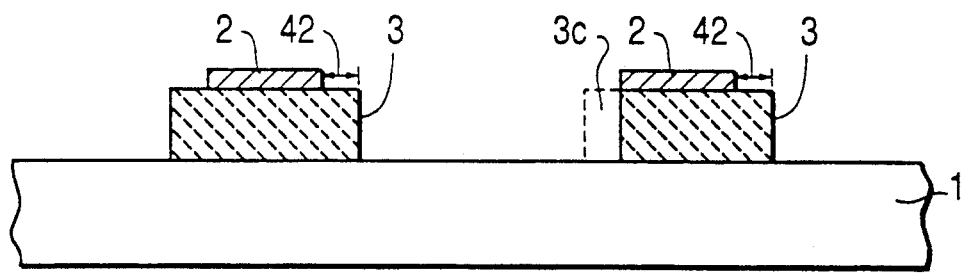
FIGS. 9(a) and 9(b) show a cross sectional view of a reticle with positive type phase-shifters in which phase-shifters are formed on a substrate and shield layer is deposited thereon, and the reticle having a defect is shown in FIG. 9(a), and the reticle repaired is shown in FIG. 9(b) (fourth embodiment)
Figure 9B:
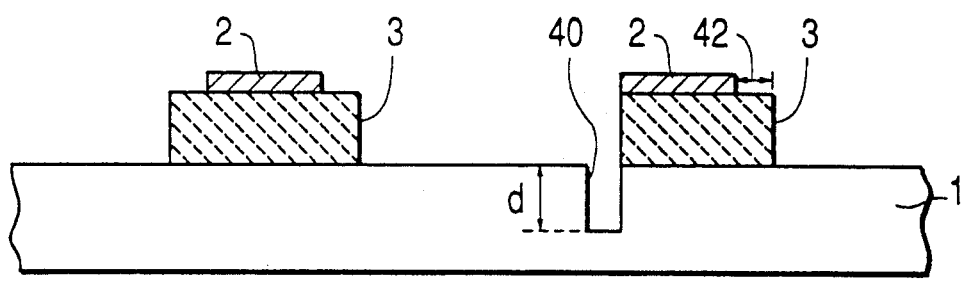

A fourth embodiment of the present invention is explained referring to FIGS. 9(a) and 9(b). FIG. 9(a) shows a cross sectional view of a reticle with phase-shifters, in which positive type phase-shifters 3 are formed on a reticle substrate 1, and a shield layer 2 of Cr is deposited thereon. The phase-shifter 3 has a shoulder portion 42 on both sides of the shield layer 2, and one shoulder portion has a defective portion 3c, which should not have been removed for the correct phase-shifter pattern to be formed.

Since processes of depositing the substrate material such as $SiO_2$ onto the defect void portion 3c and burying the void portion, are difficult because of the large thickness and lack of transparency of the deposited layer, it has been found that, when a negative type phase-shifter, namely, a groove 40 is formed under the void or missing in FIG. 9)b) portion 3c, it has the same effect as if the void portion was repaired with the deposited phase-shifter. Since the depth of the groove to be formed is d, light traveling through the groove of distance d receives a phase-shift of $\pi$ or half the wavelength of light which is the same as that caused by the phase-shifter 3.

(5) Fifth Embodiment

Figure 10:
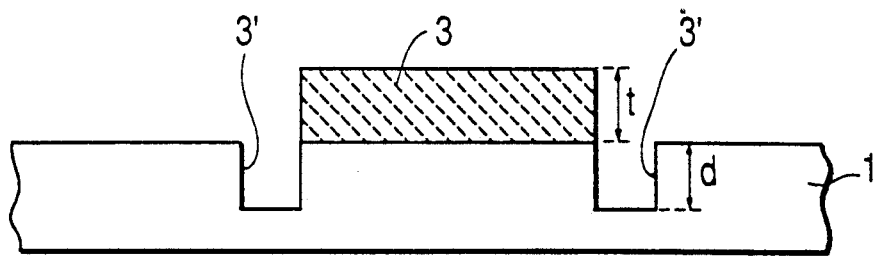
FIG. 10 shows a cross sectional view of a reticle with positive and negative type phase-shifters, in which both types of phase-shifters are formed, and no shield layer is used (fifth embodiment).

Throughout the embodiments described above, all reticles include a patterned shield layer. However, a reticle of the present invention is not limited to a reticle containing a patterned shield layer. The present invention may be applied to a reticle structure without a shield layer. FIG. 10 shows a cross sectional view of a reticle with phase-shifters, in which positive and negative type phase-shifters are formed and no shield layer is used.

A positive type phase-shifter 3 is formed on a reticle substrate 1 and a negative type phase-shifter 3' is formed on both sides of the positive type phase-shifter 3 without a shield layer.

The present invention may be embodied in other specific forms without departing from the spirit or essential characteristics thereof. The presently disclosed embodiments are, therefore, to be considered in all respects as illustrative and not restrictive. The scope of the invention is indicated by the appended claims, rather than the foregoing description, and all changes which come within the meaning and range of equivalence of the claims are, therefore, to be embraced therein.

What is claimed is:

1. A reticle for lithography to form a fine pattern image on an object by irradiating light through the reticle, comprising:
    a transparent substrate;
    a shield layer being made of a material that prevents transmission of the light and being selectively patterned and positioned on said substrate;
    a first phase-shifter adjacent to said shield layer and selectively patterned and positioned on said substrate, said first phase-shifter comprising a phase-shift material and having a thickness sufficient to produce a first phase difference between the light passing through both said substrate and said first phase-shifter and light passing through substrate areas without phase-shifters; and
    a second phase-shifter adjacent to said shield layer and selectively patterned in said substrate so as to define a groove in said substrate, said groove having a depth sufficient to produce a second phase difference between the light passing through both said groove and remaining substrate and the light passing through substrate areas without phase-shifters,
    wherein said first and second phase differences are substantially equal to a half wavelength of the light and wherein said shield layer, said first phase-shifter and said second phase-shifter are selectively patterned to define the fine pattern image during irradiation by the light.

2. A reticle as recited in claim 1, wherein said first and second phase-shifters are arranged side by side so as to share an adjacent portion of a periphery located between said first phase-shifter and said second phase-shifter.

3. A reticle as recited in claim 1, wherein said shield layer is located directly on said substrate, and a portion of said first phase-shifter and all of said second phase-shifter are located in substrate areas without said shield layer.

4. A reticle as recited in claim 1, wherein said shield layer is located on said first phase-shifter.

5. A reticle as recited in claim 1, wherein said substrate is one of quartz and glass.

6. A reticle as recited in claim 1, wherein said shield layer comprises chromium.

7. A reticle for lithography to form a fine pattern image on an object by irradiating light through the reticle, comprising:
    a transparent substrate;
    a shield layer being made of a material that prevents transmission of the light and being selectively patterned and positioned on said substrate;
    a first phase-shifter adjacent to said shield layer and selectively patterned in said substrate so as to define a first groove in said substrate, said first groove having a depth sufficient to produce a first phase difference between the light passing through both the first groove and first remaining substrate and the light passing through substrate areas without phase-shifters; and
    a second phase-shifter adjacent to said shield layer and selectively patterned within said first groove so as to define a second groove, said second groove having a depth sufficient to produce a second phase difference between the light passing through both the second groove and second remaining substrate and the light passing through the first groove and the first remaining substrate,
    wherein said first and second phase differences are substantially equal to a half wavelength of said light and wherein said shield layer, said first phase-shifter and said second phase-shifter are selectively patterned to define the fine pattern image during irradiation by the light.

8. A reticle as recited in claim 7, wherein said shield layer is located directly on said substrate and said first and second grooves are located in substrate areas without said shield layer.

9. A reticle as recited in claim 7, wherein said substrate is one of quartz and glass.

10. A reticle as recited in claim 7, wherein said patterned shield layer comprises chromium.

11. A reticle as recited in claim 7,
    wherein said first phase-shifter includes a defective portion, and
    wherein said depth of said groove of said second phase-shifter is sufficient to produce a phase-shift to correct said defective portion of said first phase-shifter.

12. A reticle as recited in claim 11, wherein said phase-shift is substantially equal to one full wavelength of said light.

13. A reticle for lithography to form a fine pattern image on an object by irradiating light through the reticle, comprising:
    a transparent substrate;

a first phase-shifter comprising a phase-shift material deposited on said substrate, said first phase-shifter having a thickness sufficient to produce a first phase difference between the light passing through both said substrate and said first phase-shifter and the light passing through said substrate without phase-shifters; and a second phase-shifter comprising a first groove located in said substrate, the second phase-shifter having a depth sufficient to produce a second phase difference between the light passing through both said groove and remaining substrate and the light passing though said substrate without phase-shifters, wherein said first and second phase-shifters are arranged adjacent to each other and said first and second phase differences are chosen so that the light passing through a portion of said first phase-shifter interferes with the light passing through an adjacent portion of said second phase-shifter, thereby enhancing resolution of the fine pattern image on the object.

14. A reticle as recited in claim 13, further comprising a second groove formed in said first groove.

15. A reticle as recited in claim 13, further comprising a second groove formed in said phase-shift material.

16. A reticle as recited in claim 13, further comprising a second groove formed in said phase-shift material and said substrate.

17. A reticle as recited in claim 13, wherein said second phase difference is substantially equal to one half wavelength of said light.